(12) United States Patent
Wu et al.

(10) Patent No.: US 10,861,771 B2
(45) Date of Patent: Dec. 8, 2020

(54) ELECTRICAL ASSEMBLY EQUIPPED WITH AUXILIARY RETENTION FOR FACILITATING HEAT SINK INSTALLATION

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Heng-Kang Wu, Shenzhen (CN); Fu-Jin Peng, Shenzhen (CN)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

(*) Notice: Subject to any disclaimer, the term of this patent is extended or adjusted under 35 U.S.C. 154(b) by 0 days.

(21) Appl. No.: 16/543,641

(22) Filed: Aug. 19, 2019

(65) Prior Publication Data

US 2020/0058572 A1 Feb. 20, 2020

(30) Foreign Application Priority Data

Aug. 17, 2018 (CN) .......................... 2018 1 0939097

(51) Int. Cl.
*H01L 23/40* (2006.01)
*H05K 7/20* (2006.01)
*H01L 23/32* (2006.01)

(52) U.S. Cl.
CPC .......... *H01L 23/4006* (2013.01); *H01L 23/32* (2013.01); *H05K 7/2049* (2013.01); *H01L 23/4093* (2013.01); *H01L 2023/405* (2013.01); *H01L 2023/4018* (2013.01);
(Continued)

(58) Field of Classification Search
CPC .... H05K 7/2039–20518; H05K 1/0201–0203; H05K 2201/066; H01L 23/40–4093; H01L 2023/4043; H01L 2023/405; H01L 2023/4062; H01L 2023/4081; H01L 2023/4087; F16B 21/00
See application file for complete search history.

(56) References Cited

U.S. PATENT DOCUMENTS 5,648,893 A * 7/1997 Loo ..................... H01L 23/4006
257/727
5,651,688 A 7/1997 Lin
(Continued)

FOREIGN PATENT DOCUMENTS

CN 1106898 A 8/1995
CN 1229279 A 9/1999
(Continued)

*Primary Examiner* — Zachary Pape
(74) *Attorney, Agent, or Firm* — Wei Te Chung; Ming Chieh Chang

(57) ABSTRACT

An electrical assembly includes an electrical connector mounted upon the PCB to receive a CPU therein. A securing seat is fixed on the PCB with four upwardly extending posts. A heat sink is secured to the posts by the screw nuts and seated upon the CPU. A auxiliary retention piece is located upon the securing seat around one post so as to prevent the CPU from excessively tilting due to the screw nut fastening occurring on an opposite diagonal corner.

20 Claims, 6 Drawing Sheets

(52) U.S. Cl.
CPC .......... *H01L 2023/4062* (2013.01); *H01L 2023/4087* (2013.01); *H05K 7/20418* (2013.01)

(56) References Cited

U.S. PATENT DOCUMENTS

| | | | | |
|---|---|---|---|---|
| 5,999,402 | A * | 12/1999 | Jeffries | G06F 1/20 165/80.3 |
| 6,829,143 | B2 * | 12/2004 | Russell | H01L 23/4006 165/80.3 |
| 7,193,853 | B2 * | 3/2007 | Chen | H01L 23/4006 165/80.3 |
| 8,724,326 | B2 * | 5/2014 | Yang | H01L 23/4093 165/185 |
| 9,196,565 | B2 * | 11/2015 | Lee | H01L 23/4006 |
| 10,103,086 | B2 * | 10/2018 | Lin | G06F 1/20 |
| 2005/0152119 | A1 * | 7/2005 | Lee | H01L 23/4093 361/710 |
| 2019/0306985 | A1 * | 10/2019 | Ferguson | H01R 12/88 |
| 2020/0126889 | A1 * | 4/2020 | Mao | H01L 23/4006 |

FOREIGN PATENT DOCUMENTS

| | | |
|---|---|---|
| CN | 2523023 Y | 11/2002 |
| CN | 2681329 Y | 2/2005 |
| CN | 1618127 A | 5/2005 |
| CN | 1874663 A | 12/2006 |
| CN | 2919529 | 7/2007 |
| CN | 207459230 U | 6/2018 |
| JP | 2017037979 A | 2/2017 |

* cited by examiner

US 10,861,771 B2

ELECTRICAL ASSEMBLY EQUIPPED WITH AUXILIARY RETENTION FOR FACILITATING HEAT SINK INSTALLATION

BACKGROUND OF THE INVENTION

1. Field of the Invention

The present invention relates generally to an electrical assembly equipped with a heat sink, and particularly to using an additional auxiliary retention piece to assemble the heat sink thereon, and the method of assembling the heat sink with assistance of such an auxiliary retention piece.

2. Description of Related Arts

U.S. Pat. No. 6,697,263 discloses an electrical connector mounted on a PCB (Printed Circuit Board) and receiving a CPU (Central Processing Unit) therein, wherein a heat sink is intimately seated upon an upper face of the CPU and fastened relative to the PCB by four screws. Anyhow, it is relatively difficult for the operator to fasten the heat sink relative to the PCB by simultaneously rotating all four screws in an even manner. Instead, the screws are fastened relative to the PCB one by one. Under this situation, the first operatively fastened screw may force the heat sink downwardly in an oblique manner, thus influencing the CPU thereunder and potentially damaging the corresponding contacts around said screw.

It is desired to have an electrical connector assembly equipped with an auxiliary retention piece for installing the heat sink upon the CPU in a relatively even manner for not tilting the CPU during the assembling procedure, thus avoiding damaging the corresponding contacts of the electrical connector.

SUMMARY OF THE INVENTION

An object of the invention is to provide an electrical assembly with an electrical connector mounted upon the PCB to receive a CPU therein. A securing seat is fixed on the PCB with four upwardly extending posts. A heat sink is secured to the posts by the nut screws and seated upon the CPU. A auxiliary retention piece is located upon the securing seat around one post so as to prevent the CPU from excessively tilting due to the screw nut fastening occurring on an opposite diagonal corner.

DETAILED DESCRIPTION OF THE PREFERRED EMBODIMENT

Figure 1:
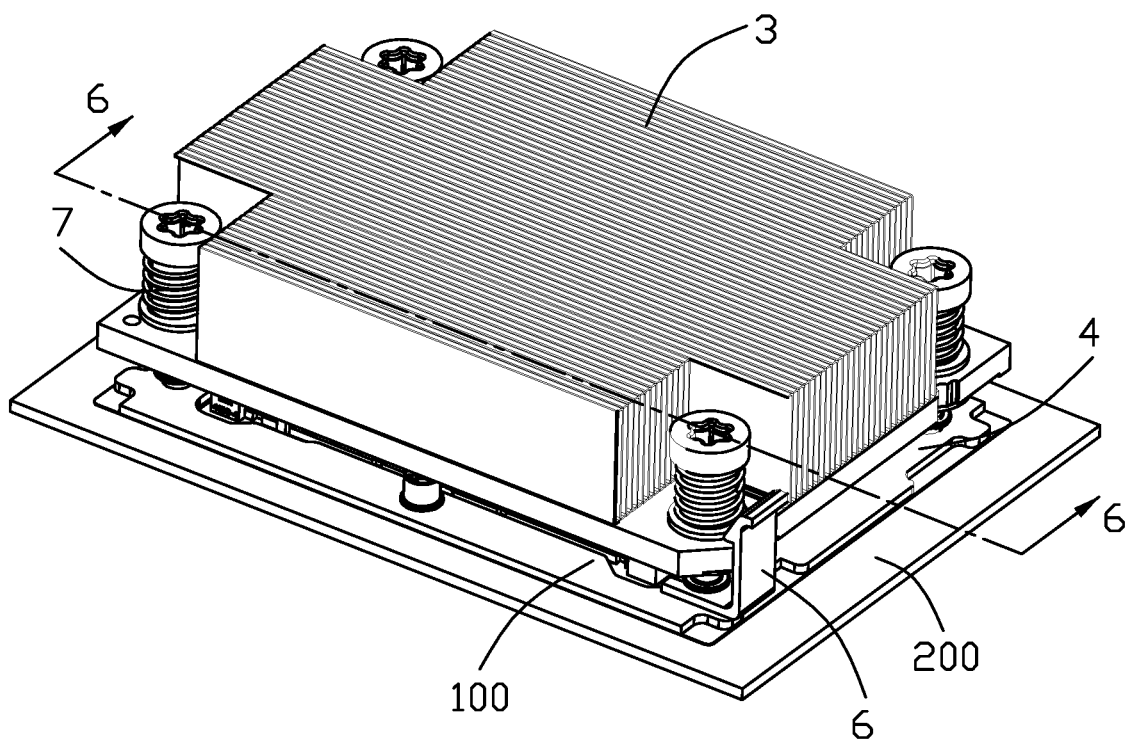
FIG. 1 is a perspective view of the electrical assembly according to the invention.
Figure 2:
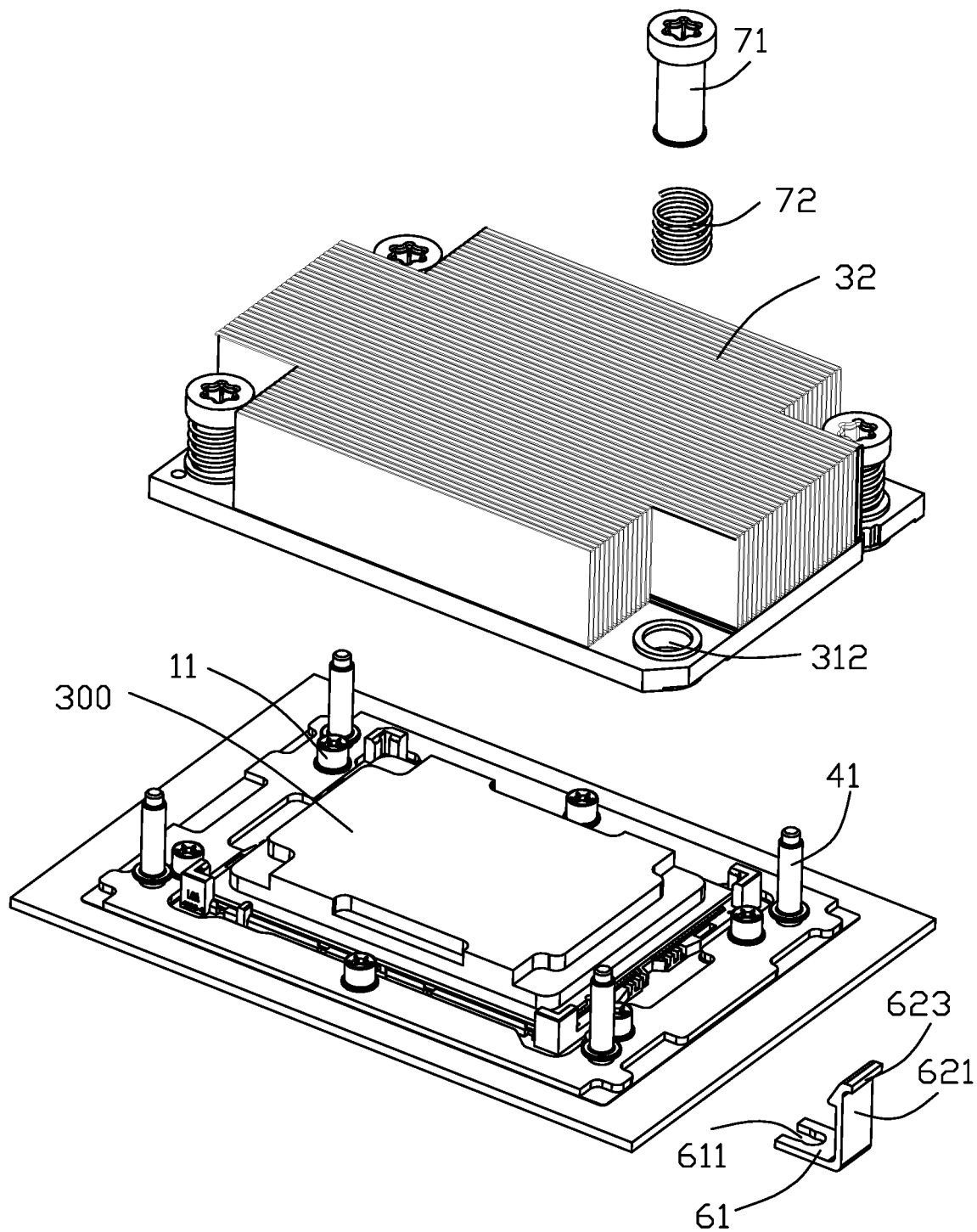
FIG. 2 is an exploded perspective view of the electrical assembly of FIG. 1.
Figure 3:
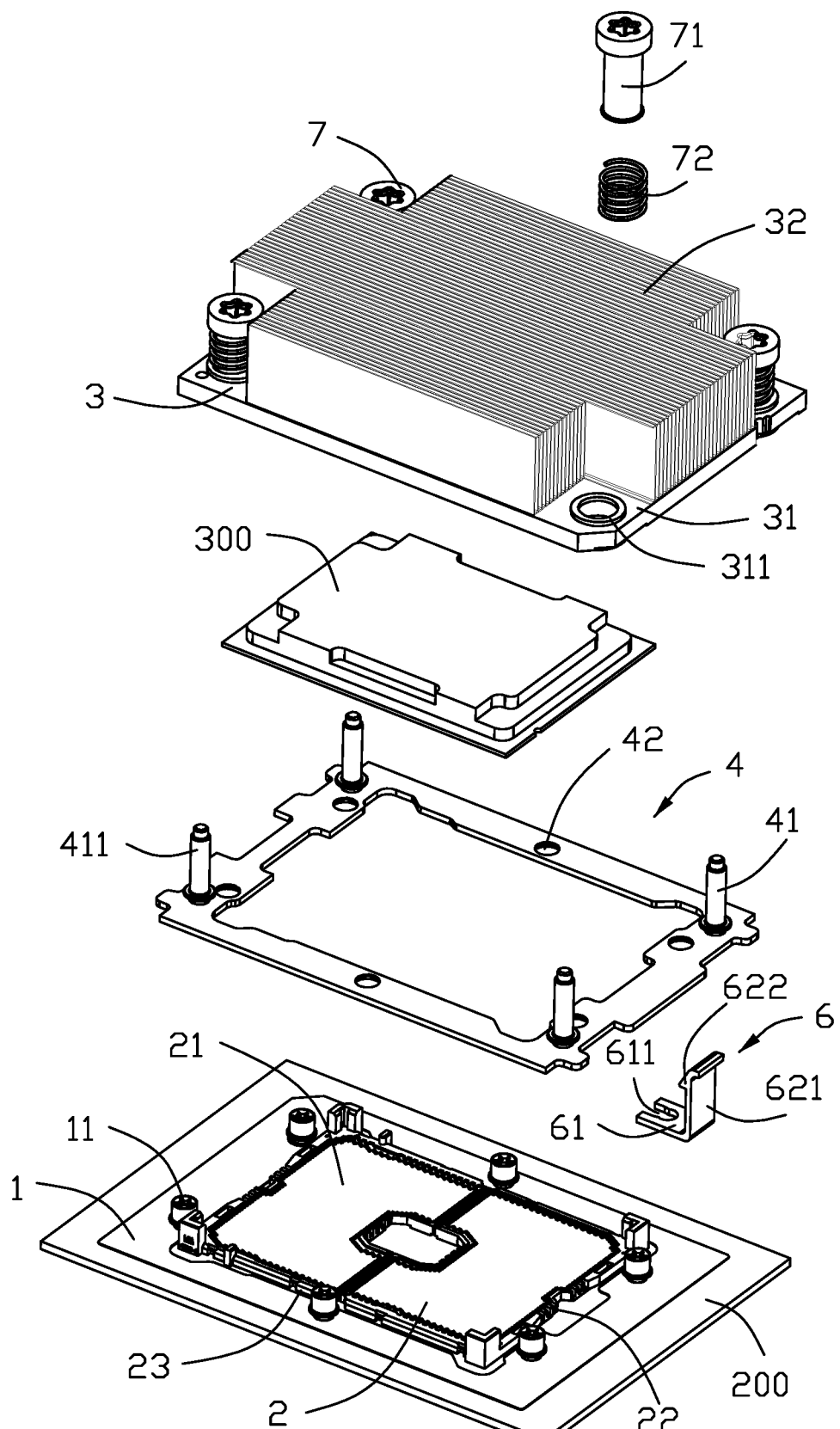
FIG. 3 is a further exploded perspective view of the electrical assembly of FIG. 1.
Figure 4:
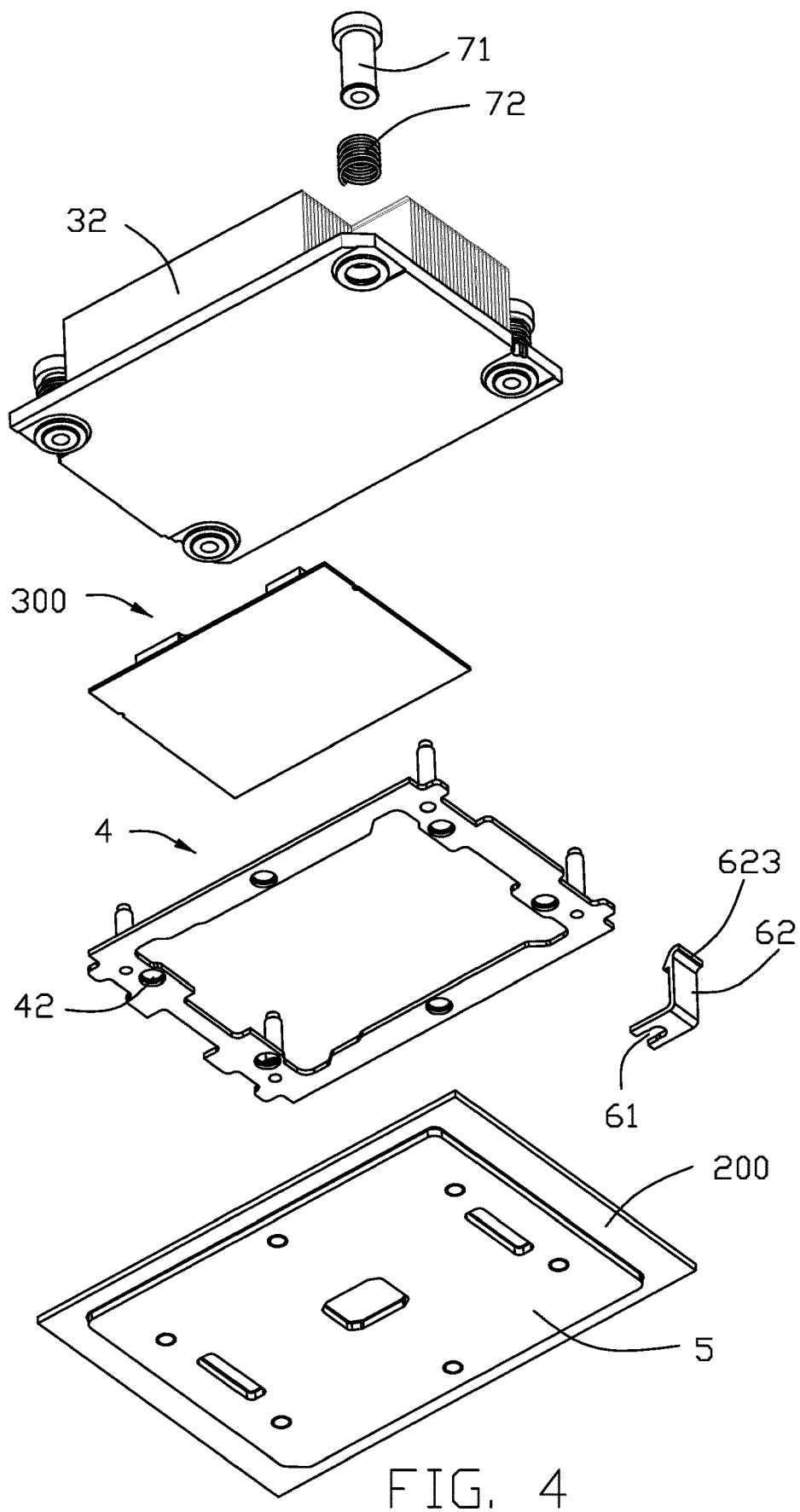
FIG. 4 is another exploded perspective view of the electrical assembly of FIG. 3.
Figure 5:
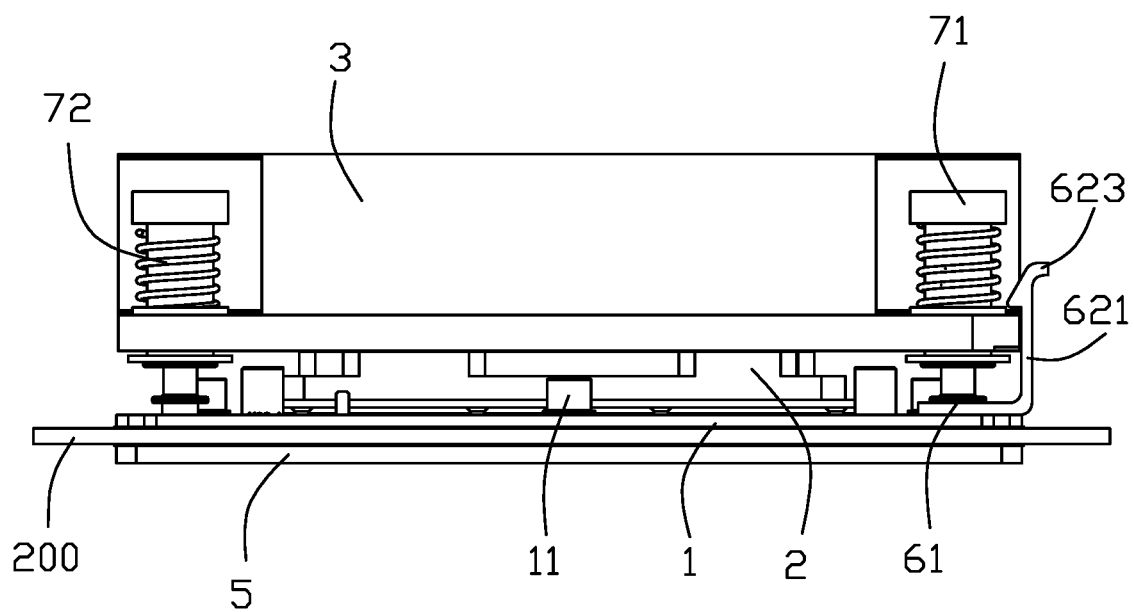
FIG. 5 is a side view of the electrical assembly of FIG. 1.
Figure 6:
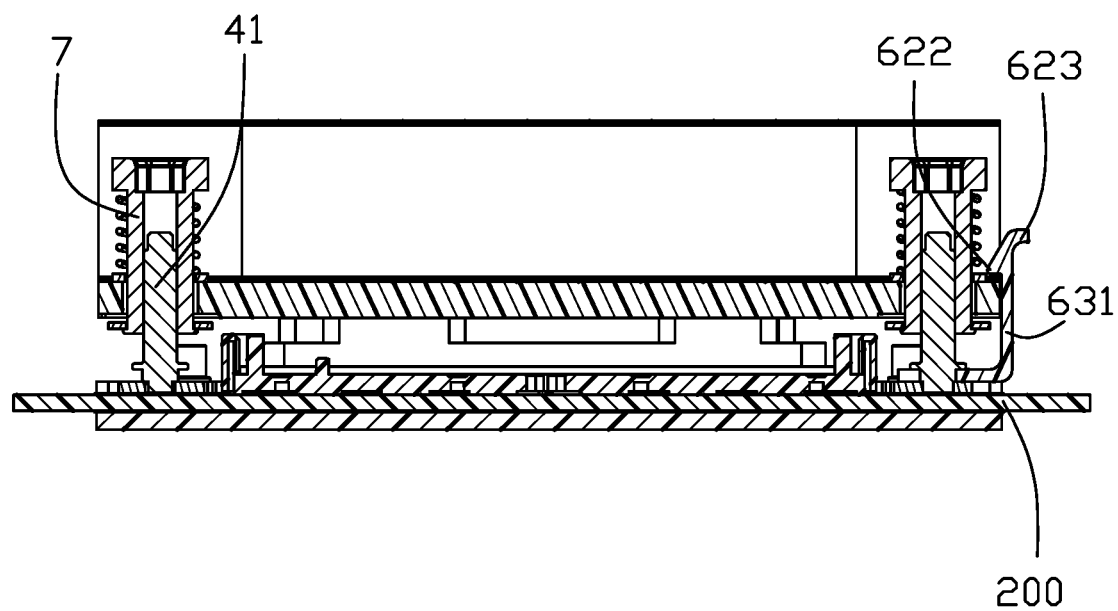
FIG. 6 is a cross-sectional view of the electrical assembly of FIG. 1.

Referring to FIGS. 1-6, an electrical assembly includes an electrical connector 2 mounted upon a PCB 200 and receive an electronic package or CPU 00 so as to establish connection between the PCB 200 and the CPU 300. The electrical assembly 100 further includes a frame like upper plate 1 and a sheet like lower plate 5 respectively positioned upon opposite top and bottom surfaces of the PCB 200. The electrical connector 2 includes an insulative housing 21 to receive a plurality of contacts (not shown) therein. A metallic frame like securing seat 4 surrounds the connector 2 and is positioned upon the PCB 200 via the upper plate 1. The CPU 300 is seated on the housing 21, and a heat sink 3 is seated upon the CPU 300.

The upper plate 1 is equipped with six fixing posts 11, of which two pairs are located respectively beside the opposite short sides 22 of the housing 21, and one pair are respectively located beside the opposite long sides 23.

The heat sink 3 includes a base 31, and a main body 32 extending upwardly from the base 31. The base 31 includes four corner sections 311 each having a through hole 312 extending therethrough in the vertical direction. The securing seat 4 includes four securing posts 41 with threads 411 thereof corresponding to the four through holes 312, and six through holes 42 corresponding to the six fixing posts 11. An auxiliary retention piece 6 is located beside one securing post 41.

The heat sink 3 is equipped with four securing parts 7 corresponding to the four through holes 312 and the associated four securing posts 41, respectively. Each securing part 7 includes a nut 71 coupling to the corresponding securing post 41, and a coil spring 72 surrounding the nut 71 and downwardly abutting against the base 31 around the corresponding through hole 312. During assembling the heat sink 3 upon the CPU 300, one nut 71 is firstly screwed, with compression of the corresponding coil spring 72, to the one specific/predetermined securing post 41 which is diagonal with regard to another one adjacent to the retention piece 6. Understandably, even though the predetermined securing post 41 and the corresponding nut 71 are firstly fastened together, the heat sink 3 will not be tilted at the diagonal/opposite corner section 311 due to engagement between the retention piece 6 and the base 31 in the vertical direction.

The resilient retention piece 6 includes a mounting part 61 with a securing hole/slot 611 therein for secured to a bottom section of the corresponding securing post 41, and a restriction part 62 extending upwardly from the mounting part 61. The restriction part 62 includes an upstanding part 621 extending upwardly from the mounting part 61, a hook section 622 at the top of the upstanding part 621 for engagement with the base 31 of the heat sink 3 when the nut 71 has not fastened to the corresponding securing post 41, and an operation section 623 opposite to the hook section 622

The whole assembling process is as follows. The securing seat 4 is firstly to have the through holes 42 secured to the corresponding fixing posts 11, and the retention piece 6 is assembled to the corresponding securing post 41 via interference. The CPU 300 is successively mounted upon the housing 21, and the heat sink 3 is positioned upon the CPU 300 to have the securing posts 41 extend through the corresponding through holes 312, respectively. One nut 71 associated with the corresponding coil spring 72 is first screwed to a specific/predetermined securing post 41 without upwardly raising an opposite diagonal corner section 31 due to engagement between the restriction piece 6 and the opposite diagonal corner section 31 in the vertical direction. The remaining three nuts 71 with the associated coil springs 72 are further assembled to the corresponding securing posts 41, respectively, to finalize the whole assembly. Because no significant tilting occurs of the heat sink 3, there is no significant tilting of the CPU 300 under the heat sink 3. As a result, because of no tilting of the CPU 300, there is no potential damage of the contacts around the first assembled nut 71 advantageously compared with the traditional one without the retention piece 6. Understandably, the engagement between the retention piece 6 and the base 31 will not exist once the four nuts 71 are completely fastened to the corresponding securing posts 41, respectively.

What is claimed is:

1. An electrical assembly comprising:
   a PCB (Printed Circuit Board;
   an electrical connector having an insulative housing seated upon the PCB and a plurality of contacts therein;
   an electronic package positioned in the housing;
   a metallic securing seat affixed upon the PCB and including four upwardly extending securing posts respectively located at four corners thereof;
   a heat sink positioned upon the electronic package and forming at four corners thereof four through holes through which the four securing posts upwardly extend, respectively;
   four securing parts positioned on the corresponding through holes, respectively, each of said securing parts including a nut attached to the corresponding securing post, and a coil spring surrounding the nut and downwardly abutting against the heat sink; and
   a retention piece located around one of said four securing posts and having a hook downwardly engaging the heat sink for preventing upward movement of the heat sink around said one of the four securing posts.

2. The electrical assembly as claimed in claim 1, wherein the retention piece is retained to the corresponding securing post.

3. The electrical assembly as claimed in claim 2, wherein the retention piece includes a horizontal mounting part secured to the corresponding securing post, and a deflectable restriction part extending upwardly from the mounting part with at an upper end the hook adapted to downwardly press the heat sink.

4. The electrical assembly as claimed in claim 3, wherein the horizontal mounting part forms a securing slot to receive the corresponding securing post therein.

5. The electrical assembly as claimed in claim 1, further including a frame like upper plate securely positioned upon the PCB and surrounding the housing, wherein the securing seat is secured to said upper plate to achieve affixation with regard to the PCB.

6. The electrical assembly as claimed in claim 5, wherein the upper plate includes a plurality of fixing posts to be securely received within corresponding through holes of the securing seat.

7. The electrical assembly as claimed in claim 5, further including a lower plate supportably attached intimately on an underside of the PCB.

8. The electrical assembly as claimed in claim 1, wherein the heat sink includes a base and a fin like main body extending upwardly from the base, and the four through holes are formed at said four corners of the base.

9. A method of assembling an electrical assembly comprising steps of:
   providing a PCB (Printed Circuit Board) with opposite top and bottom surfaces;
   providing an electrical connector with an insulative housing and a plurality of contacts in the housing;
   mounting the connector upon the top surface of the PCB;
   providing a metallic securing seat with four securing posts at four corners;
   mounting the securing seat upon the PCB in a fixation manner;
   providing a retention piece upon the securing seat proximal to a selected one securing post;
   loading a CPU (Central Processing Unit) upon the connector;
   providing a heat sink with four through holes at four corners thereof;
   positioning said heat sink upon the CPU with said securing posts extending through the corresponding through holes, respectively;
   providing four securing parts each with a nut and a spring; and
   fastening one nut to the corresponding securing post which is essentially diagonally opposite to the selected securing post which the retention piece is proximal to; wherein the retention piece is downwardly engaged with the heat sink for preventing upward movement of the heat sink around said selected one securing post.

10. The method as claimed in claim 9, wherein said retention piece is fastened to the selected securing post.

11. The method as claimed in claim 10, wherein the retention piece includes a horizontal mounting part and a restriction part extending upwardly from the mounting part with a hook at a top end.

12. The method as claimed in claim 11, wherein the hook is spaced from the heat sink once all four nuts are completely fastened to the corresponding securing posts.

13. The method as claimed in claim 9, further including a step of mounting a frame like upper plate upon the top surface of the PCB, wherein the securing seat is affixed to the upper plate.

14. The method as claimed in claim 13, wherein the upper plate forms a plurality of fixing post extending through corresponding through holes of the securing seat.

15. The method as claimed in claim 9, wherein said spring is a coil spring surrounding the corresponding nut.

16. An electrical connector assembly for mounting a heat sink upon a CPU (Central Processing Unit), comprising:
   an insulative housing adapted to be mounted upon a PCB (Printed Circuit Board) and receive the CPU therein;
   a frame like upper plate adapted to be mounted upon the PCB and surrounding the housing;
   a securing seat surrounding the housing and including a plurality of upwardly extending securing posts at four corners; and
   a resilient retention piece secured to one selected securing post and including a hook adapted to downward press the heat sink; further including four retention parts each including a nut for securing to a corresponding securing post, and a coil spring surrounding the nut and adapted to downwardly press the heat sink.

17. The electrical assembly as claimed in claim 16, wherein said retention piece includes a horizontal mounting part and a resilient restriction part upwardly extending from the horizontal part with said hook formed at a top end thereof.

18. The electrical assembly as claimed in claim 17, wherein the horizontal mounting part forms a securing slot receiving the selected securing post therein.

19. The electrical assembly as claimed in claim 17, wherein said retention piece forms an L-shaped configuration.

20. The electrical assembly as claimed in claim 6, wherein said resilient retention piece is spaced from the CPU when the CPU is received within the insulative housing.

\* \* \* \* \*